United States Patent
Lin et al.

(10) Patent No.: US 7,233,530 B2
(45) Date of Patent: Jun. 19, 2007

(54) SYSTEM AND METHOD FOR OVER ERASE REDUCTION OF NITRIDE READ ONLY MEMORY

(75) Inventors: Ching-chung Lin, Hsinchu (TW); Nai-ping Kuo, Hsinchu (TW); Han-sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/328,941

(22) Filed: Jan. 9, 2006

(65) Prior Publication Data

US 2006/0120153 A1 Jun. 8, 2006

Related U.S. Application Data

(63) Continuation of application No. 10/886,076, filed on Jul. 6, 2004, now Pat. No. 7,002,850.

(51) Int. Cl.
 G11C 16/34 (2006.01)
(52) U.S. Cl. .............................. 365/185.3; 365/185.11; 365/185.22
(58) Field of Classification Search .............. 365/185.3
See application file for complete search history.

(56) References Cited

U.S. PATENT DOCUMENTS

| 5,473,563 | A | * | 12/1995 | Suh et al. .............. 365/185.13 |
| 6,219,280 | B1 | * | 4/2001 | Naganawa ............. 365/185.22 |
| 6,385,093 | B1 | | 5/2002 | Bautista, Jr. et al. |
| 7,002,850 | B2 | * | 2/2006 | Lin et al. ................. 365/185.3 |

* cited by examiner

Primary Examiner—Tan T. Nguyen
(74) Attorney, Agent, or Firm—Martine Penilla & Gencarella, LLP (57) ABSTRACT

A nitride read only memory (NROM) erase system is disclosed. The NROM erase system comprises at least one memory sector, N sense amplifiers, and N buffers. The memory sector is segmented into N erase retry units according to the number of the sense amplifiers. One buffer corresponds with one erase retry unit and one sense amplifier. The N buffers are used to indicate whether their corresponding erase retry units are erased after an erase process of an erase operation. One of the buffers will be set if its corresponding erase retry unit is not erased. In this case, a subsequent erase process will begin to erase the un-erased erase retry unit. The erase retry units that are erased in a previous erase process will not be affected by the subsequent erase process. A method for using the NROM erase system is also described.

6 Claims, 5 Drawing Sheets

SYSTEM AND METHOD FOR OVER ERASE REDUCTION OF NITRIDE READ ONLY MEMORY

CROSS REFERENCE TO RELATED APPLICATION

This application is a continuation of U.S. application Ser. No. 10/886,076, filed on Jul. 6, 2004 now U.S. Pat. No. 7,002,850, the disclosure of which is incorporated herein by reference.

BACKGROUND OF THE INVENTION

1. Field of the Invention

The present invention relates generally to nitride read only memoiy (NROM) devices, and more particularly, to a NROM erase system and method for over erase reduction during an erase operation.

2. Description of the Related Art

Nitride read only memories (NROM) are nonvolatile memories in which a single NROM cell can be electrically programmed and a large number of NROM cells —called a sector—are electrically erasable at the same time. There are three basic operations for a NROM device: read (a byte or a word), program (a byte or a word), erase (one or more sectors).

To erase a single sector for a NROM device, a high electric field must be applied between the sources and the gates of the NROM cells belonging to the sector to allow for Fowler-Nordheim current to discharge the floating gates of the NROM cells. This task is accomplished by applying a high voltage (in the range of 12V) to the sources of the NROM cells to be erased while grounding their gates (source erase), or by splitting the biasing voltage between sources and gates of the NROM cells to be erased (negative gate erase).

The erase operation of a NROM device is more complicated than the read and program operations because the erase operation is performed on an entire sector. An erase operation comprises at least one erase process and at least one verification process. Due to the fact that each NROM cell of a sector processes different erasing ability, multiple erase processes might be needed for an erase operation in order to erase all the NROM cells of the sector. A verification process is performed after an erase process is finished during the erase operation.

At the beginning of the erase operation, an initial erase voltage pulse is applied to all the NROM cells belonging to the sector to be erased. A verification process of the erase operation is followed to verify whether all the NROM cells of the sector are erased after the erase process of the erase operation. If the verification process is failed for at least one NROM cell of the sector, a higher erase voltage pulse is applied to all the NROM cells of the sector to erase the remaining un-erased NROM cells. Another verification process is performed to verify whether all the NROM cells of the sector are erased. If some of the NROM cells still remain un-erased, the erase processes and the verification processes will continue until all the NROM cells of the sector are erased. For an erase process, the erase voltage pulse for a subsequent erase process is higher than the erase voltage pulse for a previous erase process. The increase of the erase voltage pulse for each subsequent erase process is about 400 mV. Because the erase voltage pulse is applied to the entire sector during the multiple erase processes, the NROM cells erased by a previous erase process will become over-erased during subsequent erase processes.

Figure 1:
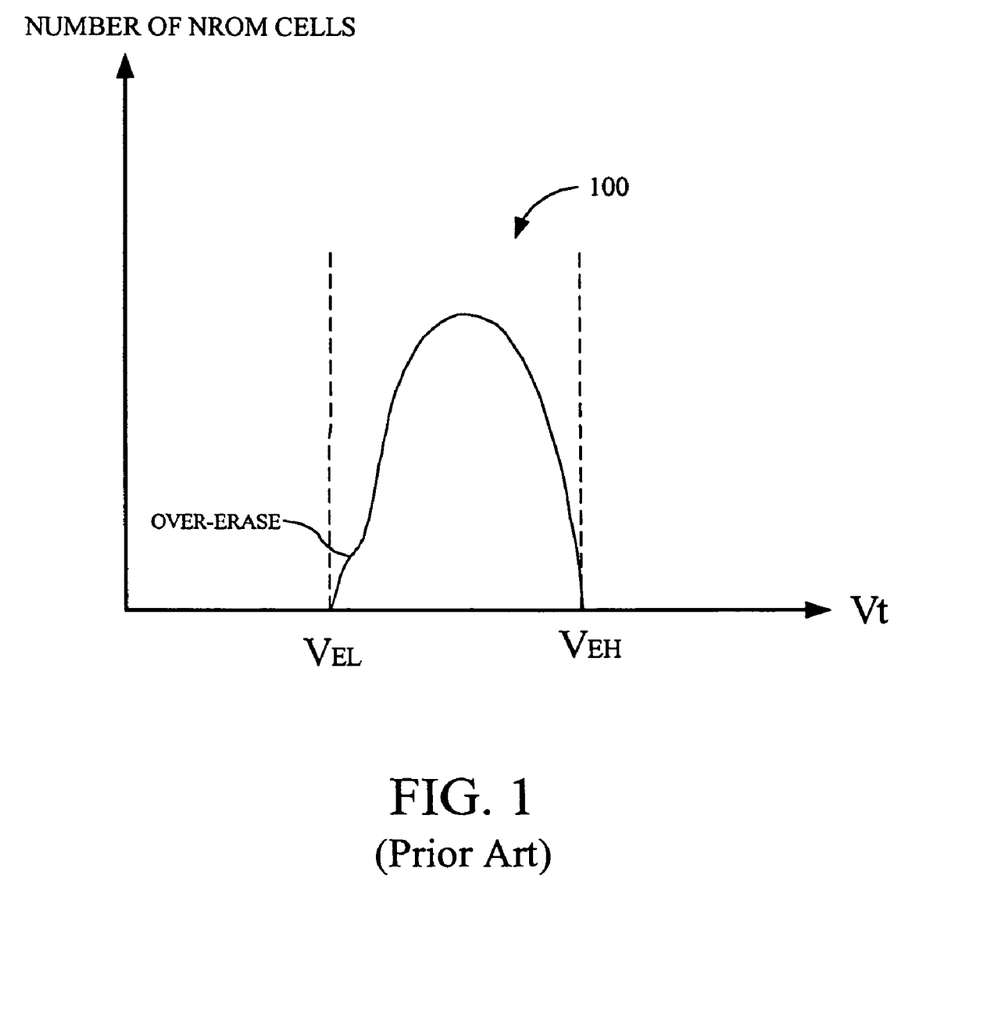
FIG. 1 is a graph showing the threshold voltage distribution of the erased nitride read only memory (NROM) cells of a sector after an erase operation.

FIG. 1 is a threshold voltage distribution graph 100 showing the threshold voltage Vt distribution of the erased NROM cells of a sector after an erase operation. The threshold voltages of the erased sector are distributed between the high threshold voltage $V_{EH}$ and the low threshold voltage $V_{EL}$. As indicated, the threshold voltage distribution graph 100 is crooked near the $V_{EL}$, which is caused by the over-erased NROM cells of the sector after multiple erase processes during an erase operation. The over erase for the NROM cells also causes the threshold voltages of those over-erased NROM cells to be too low.

In view of the foregoing, there is a need for improvement upon conventional NROM erase systems and methods in order to prevent the NROM cells of a sector from being over-erased.

SUMMARY OF THE INVENTION

Broadly speaking, the present invention fills this need by providing a new NROM erase system that will reduce over-erased NROM cells during an erase operation. A method for using this NROM erase system is also described.

In accordance with one aspect of the present invention, a new NROM erase system is provided for an erase operation which includes at least one erase process and at least one verification process. This new NROM erase system includes at least one NROM sector, N sense amplifiers, and at least N buffers. The NROM sector is segmented into N erase retry units according to the number of the sense amplifiers. At least one buffer corresponds with one sense amplifier and one erase retry unit. The N buffers are used to indicate whether their corresponding erase retry units are erased after an erase process of an erase operation. If one NROM cell belonging to an erase retry unit is not erased after an erase process of an erase operation, the buffer corresponding to this erase retry unit will be set. If one of the buffers is set after an erase process, a subsequent erase process of the erase operation will begin to erase the NROM cells belonging to the erase retry units that are not erased during the erase process. The NROM cells belonging to the erase retry units that are erased during the erase process will not be affected by the subsequent erase process of the erase operation. In one embodiment, the subsequent erase voltage pulse used for the subsequent erase process of the erase operation could be slightly higher than the erase voltage pulse used for the previous erase process of the erase operation. The increase of the subsequent erase voltage pulse could be as low as 200 mV. In one embodiment, only K erase retry units can be erase concurrently by an erase voltage pulse, wherein K is calculated based on the capacity of the pumping circuit of the NROM erase system. K is an integer and is less than or equal to N.

In accordance with another aspect of the present invention, a method for using this new NROM erase system is also described. In this method, a NROM sector is selected and divided into N erase retry units according to the number of sense amplifiers (N sense amplifiers). At least N buffers will used to indicate whether the N erase retry units are erased after an erase process of an erase operation. At least one buffer corresponds with one erase retry unit and one sense amplifier.

During an erase process, an erase voltage pulse will be applied to the erase retry units that need to be erased. If the erase process is an initial erase process, all of the N erase retry units need to be erased by the erase voltage pulse once.

If the erase process is not an initial erase process, the N buffers will be checked to obtain which erase retry units need to be erased. In one embodiment, at most K erase retry units can be erased concurrently by an erase voltage pulse if the number of the erase retry units to be erased is more than K. Being an integer and less than or equal to N, K is calculated based on the capacity of the pumping circuit of the NROM erase system.

A verification process will follow an erase process during the erase operation. The verification process is performed by reading word by word of the NROM sector to be erased with one bit per erase retry unit per I/O. During the verification process, if any bit of the word is un-erased, the buffer corresponding to the erase retry unit at which the un-erased bit of the word is located will be set. In one embodiment, a verification process begins from an address stored at an address counter. If the verification process is an initial verification process, the address stored at the address counter is the starting address of the NROM sector; otherwise, the address will be the address at where the first un-erased word locates during a previous verification process of the erase operation. The verification process will be completed if the last word of the NROM sector is read or if all of the N buffers are set.

After the verification process, the N buffers will be checked to see whether any of the buffers is set. If at least one of the buffers is set, a subsequent erase process of the erase operation will be started. A subsequent verification process will follow the subsequent erase process of the erase operation. During the subsequent erase process of the erase operation, only the NROM cells belonging to un-erased erase retry units will be given an subsequent erase voltage pulse. In one embodiment, the subsequent erase voltage pulse is slightly higher (about 200 mV) than the erase voltage pulse used in the previous erase process of the erase operation.

The erase process and the verification process of the erase operation will continue until all NROM cells belonging to the N erase retry units of the NROM sector are erased.

Because the NROM cells belonging to the erase retry units that are erased during the previous erase process will not be affected by the subsequent erase voltage pulse during the subsequent erase process of the erase operation, the over-erased NROM cells of the NROM erase system is reduced. Furthermore, as more and more erase retry units are erased after previous erase processes of the erase operation, less and less NROM cells will need to receive the subsequent erase voltage pulse. Therefore, the increase for the subsequent erase voltage pulse is slowed down. As a result, the erase voltage is optimized. Moreover, since only K erase retry units can be erase concurrently, the band-to-band tunneling current of the NROM cells can be reduced during the erase operation. In addition, the use of the address counter saves the time needed for a subsequent verification process of the erase operation.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 2:
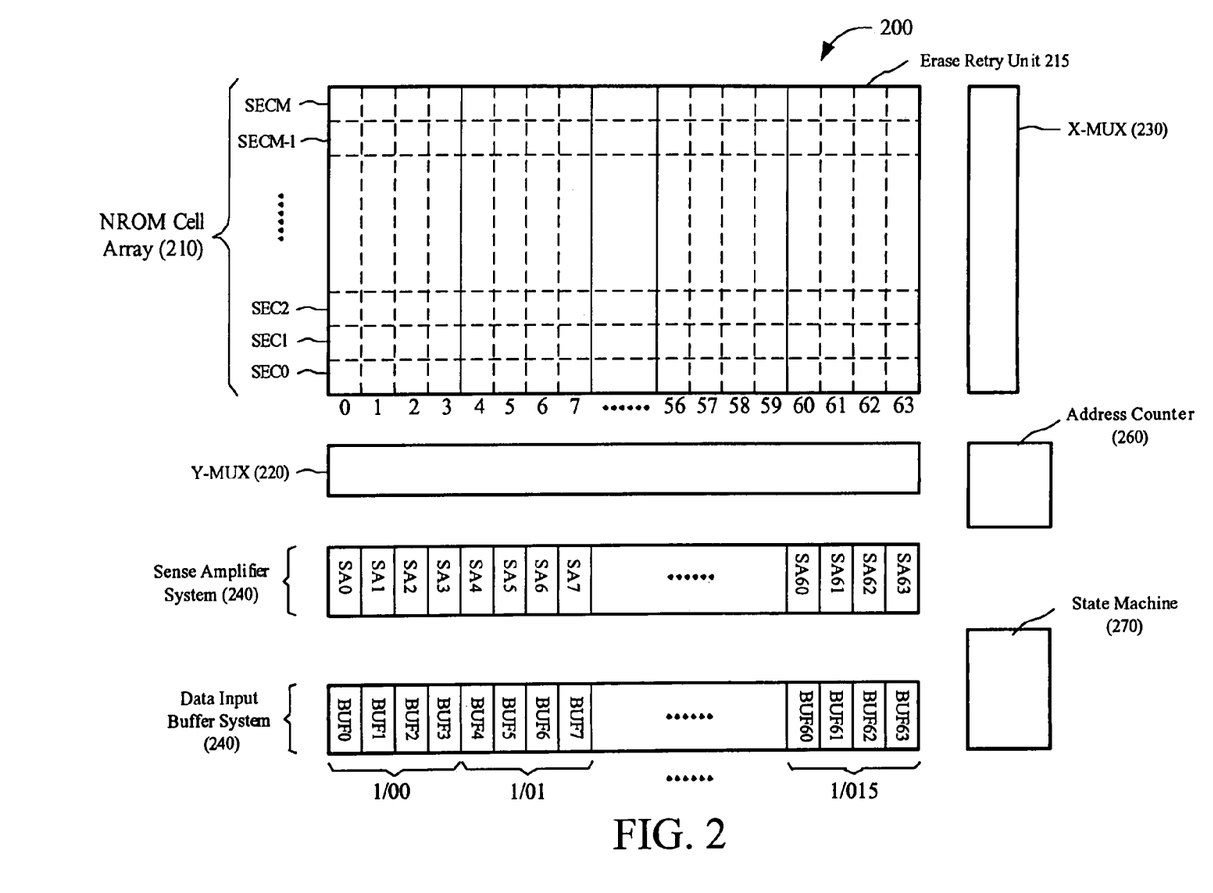
FIG. 2 is a conceptual block diagram illustrating a NROM erase system in accordance with one embodiment of the present invention.

Referring initially to FIG. 2, a NROM erase system 200 is shown in accordance with one embodiment of the present invention. The NROM erase system 200 includes a NROM cell array 210, a Y-multiplexer (MUX) 220, a X-MUX 230, a sense amplifier system 240, a data input buffer system 250, an address counter 260, and a state machine 270.

This NROM erase system 200 has 16 I/Os (I/O0, I/O1, . . . , I/O15). Because 4 words (64 bits) need to be read simultaneously during a page read operation, each I/O is configured to have 4 bits. Accordingly, each I/O of the NROM erase system 200 needs to have 4 buffers and 4 sense amplifiers. Thus, the sense amplifier system 240 and the data input buffer system 250 have 64 sense amplifiers (SA0, SA1, . . . , SA63) and 64 buffers (BUF0, BUF1, . . . , BUF 63), respectively.

The NROM cell array 210 is divided into M sectors (SEC0, SEC1, . . . , SEC M), while M is an integer. Based on the number of sense amplifiers in the sense amplifier system 240, each sector of the NROM cell array 210 is further divided into 64 erase retry units with 4 erase retry units per I/O. One of the erase retry units of the SEC M is shown in FIG. 2 as the erase retry unit 215. Preferably, one sector of the NROM cell array 210 has 1M bits and each erase retry unit has 16K bits. The X-MUX 230 will select which sector of the NROM cell array 210 will be erased, while the Y-MUX 220 will select which erase retry unit of the selected sector will be given an erase voltage pulse. The address counter 260 is used to store a verification address from where a verification process will begin. The state machine 270 will control the internal embedded control algorithms during the erase operation.

Figure 3:
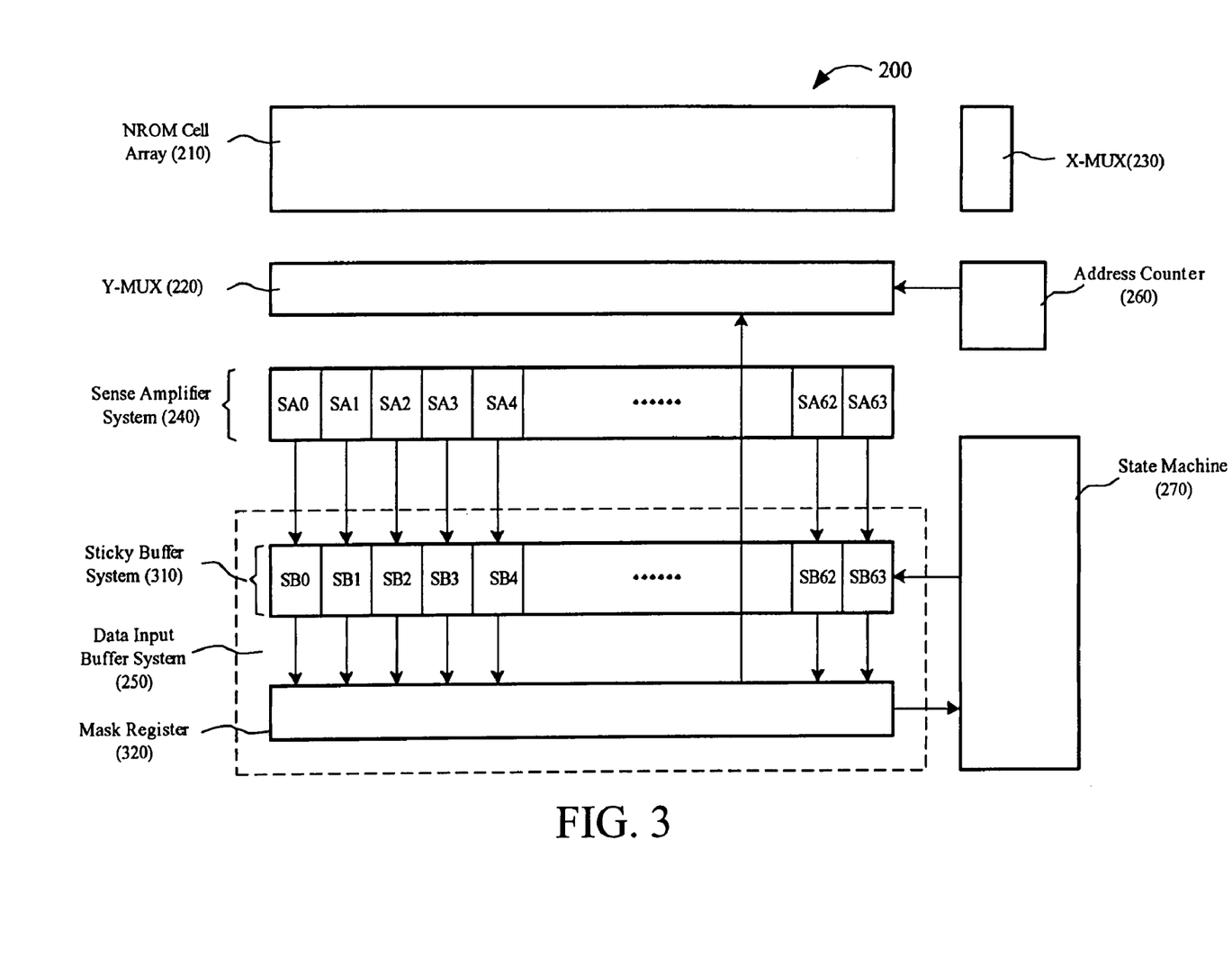
FIG. 3 is a detailed conceptual block diagram illustrating the NROM erase system in accordance with the embodiment shown in FIG. 2.

As shown in FIG. 3, the data input buffer system 250 comprises a sticky buffer system 310 with 64 sticky buffers (SB0, SB1, . . . , SB63) and one mask register 320. One sticky buffer corresponds with one erase retry unit and one sense amplifier. Before an erase operation that includes at least one erase process and at least one verification process, all the NROM cells of the sector to be erased are pre-programmed, for example, to "0". The state machine 270 will reset all the sticky buffers of the sticky buffer system 310 before each erase process of an erase operation. The sense amplifier system 240 will pass the verification results of all the erase retry units of the sector to the sticky buffer system 310 during a verification process of the erase operation. The mask register 320 will gather the verification results of all of the erase retry units of the sector from the sticky buffer system 310.

Before an erase operation, the state machine 270 will also obtain a pre-determined K value that is calculated based on the internal or external pumping circuit of the NROM erase system 200. The K value is determined so that the pumping circuit is able to supply sufficient current load when K number of erase retry units are erased simultaneously under various operating conditions. If the NROM erase system 200 is powered by a changeable external pumping circuit, the K value varies depending upon the capacity of the external pumping circuit used. Being an integer and less than or equal to the number of erase retry units of the sector to be erased, the pre-determined K value is the maximum number of erase retry units that can be erased at the same time.

For the initial erase process of an erase operation, an initial erase voltage pulse needs to be applied to all the erase retry units (all the NROM cells) of the sector. If the K value stored at the state machine 270 is less than 64, only K number of erase retry units will be given the initial erase voltage pulse simultaneously, preferably starting from the left to the right of the sector. If the number of the remaining erase retry units of the sector is still more than K after the initial erase voltage pulse is given to K number of erase retry units, another K number of erase retry units will be given the initial erase voltage pulse concurrently. Otherwise, all the remaining erase retry units of the sector will be erased at the same time. The initial erase process is completed when all 64 erase retry units are given the initial erase voltage pulse once.

A initial verification process follows the initial erase process to verify whether all the NROM cells of the sector are erased. During the initial verification process, the entire sector is read word by word with one bit per erase retry unit per I/O. The initial verification process usually starts from the beginning address to the ending address of the sector. However, if all sticky buffers are set in the middle of a verification process, the verification process will not continue because no further verification is needed. If any bit of the word read is not erased, this word is considered un-erased. If the un-erased word is a first un-erased word since the beginning of the verification process, the address of the first un-erased word will be stored to the address counter 260 so that the subsequent verification process will start from this address. Thus, less verification time might be needed for the subsequent verification process.

During a verification process of the erase operation, if one bit (one NROM cell) of the word read is not erased, the erase retry unit to which the un-erased NROM cell belongs is considered un-erased. The sense amplifier that corresponds to the un-erased erase retry unit will pass the failed result to its corresponding sticky buffer which will be set to "1" accordingly. If all the NROM cells belonging to an erase retry unit are erased, the corresponding sense amplifier will pass the verification result to the corresponding sticky buffer that will remain to "0".

After a verification process, the mask register 320 will collect verification results of all the erase retry units of the sector from the sticky buffer system 310. The collected verification information will be passed to the Y-MUX 230 and the state machine 270 such that the NROM erase system 200 knows which erase retry units need to erased again during a subsequent erase process.

During a subsequent erase process, only the erase retry units that are not erased during previous erase processes will be given a subsequent erase voltage pulse. Since no subsequent erase voltage pulse will be applied to the NROM cells belonging to the erase retry units that are erase previously, the NROM erase system 200 has low over erase probability. The maximum number of erase retry units that can be given a subsequent erase voltage pulse concurrently is K. As more and more erase retry units are erased by previous erase processes, less and less erase retry units of the sector need the subsequent erase voltage pulse during the subsequent erase process. Thus, the subsequent erase voltage pulse can be slightly higher than the erase voltage pulse used in the previous erase process. The increase of the subsequent erase voltage pulse can be as low as 200 mV.

Due to the different erase ability of the NROM cells of the sector to be erased, multiple erase processes and verification processes might be needed for an erase operation for the sector. The erase processes and the verification processes will continue until all 64 erase retry units are successfully erased, i.e., all the sticky buffers are "0".

Figure 4:
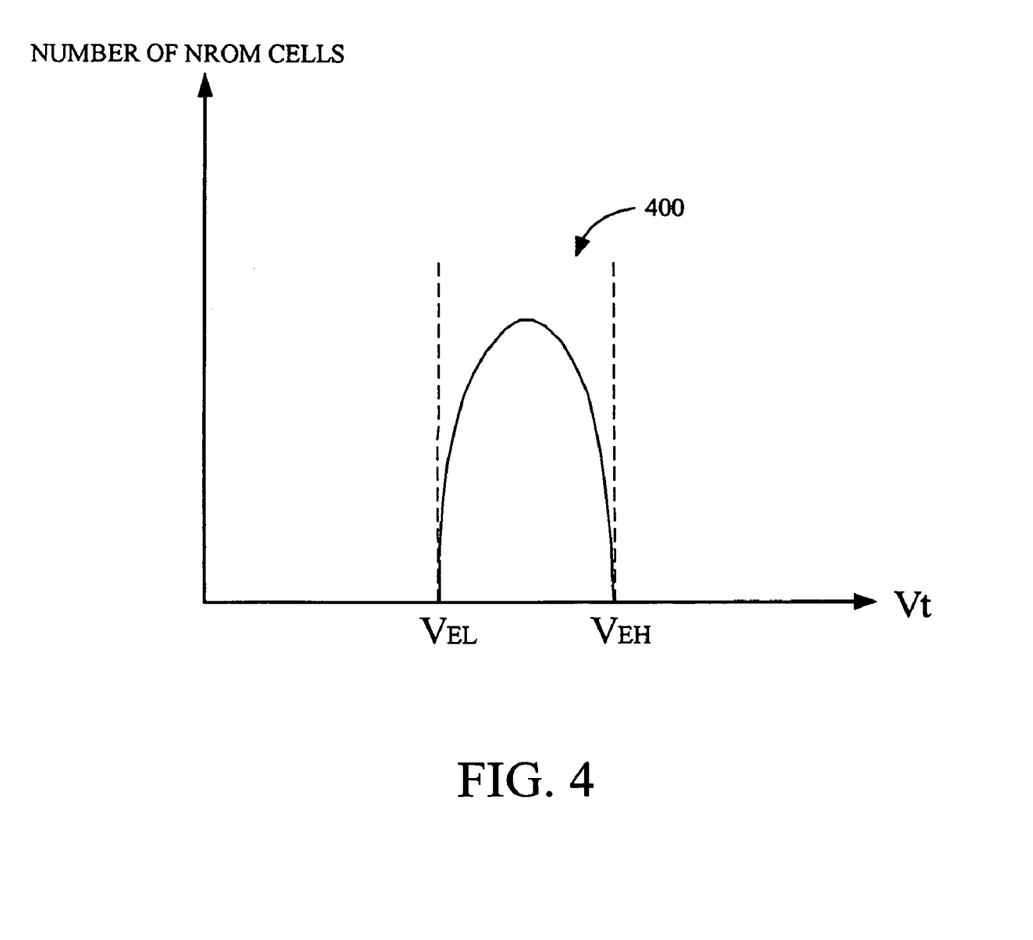
FIG. 4 is a graph showing the threshold voltage distribution of the erased NROM cells of a sector after an erasing operation in accordance with the embodiment for FIG. 2 and FIG. 3.

Referring now to FIG. 4, a threshold voltage distribution graph 400 is shown illustrating the threshold voltage Vt distribution of the erased NROM cells of a sector in the NROM cell array 210 after an erasing operation in accordance with the embodiment of the present invention shown in FIG. 2 and FIG. 3. As mentioned above, once an erase retry unit of the sector to be erased is successfully erased in a previous erase process, no more erase voltage pulse will be applied to the NROM cells belonging to this erase retry unit. Therefore, the over erase problem is reduced for the NROM erase system 200. As compared with the FIG. 1, the threshold voltage distribution graph 400 has the same high erased threshold voltage $V_{EH}$; however, the low erased threshold voltage $V_{EL'}$ is higher than the low erased threshold voltage $V_{EL}$ in FIG. 1. Hence, the threshold voltage distribution graph 400 is tightened. Furthermore, the smoothness of the threshold voltage distribution graph 400 indicates that less or none over-erased NROM cells exists after the erase operation.

Figure 5:
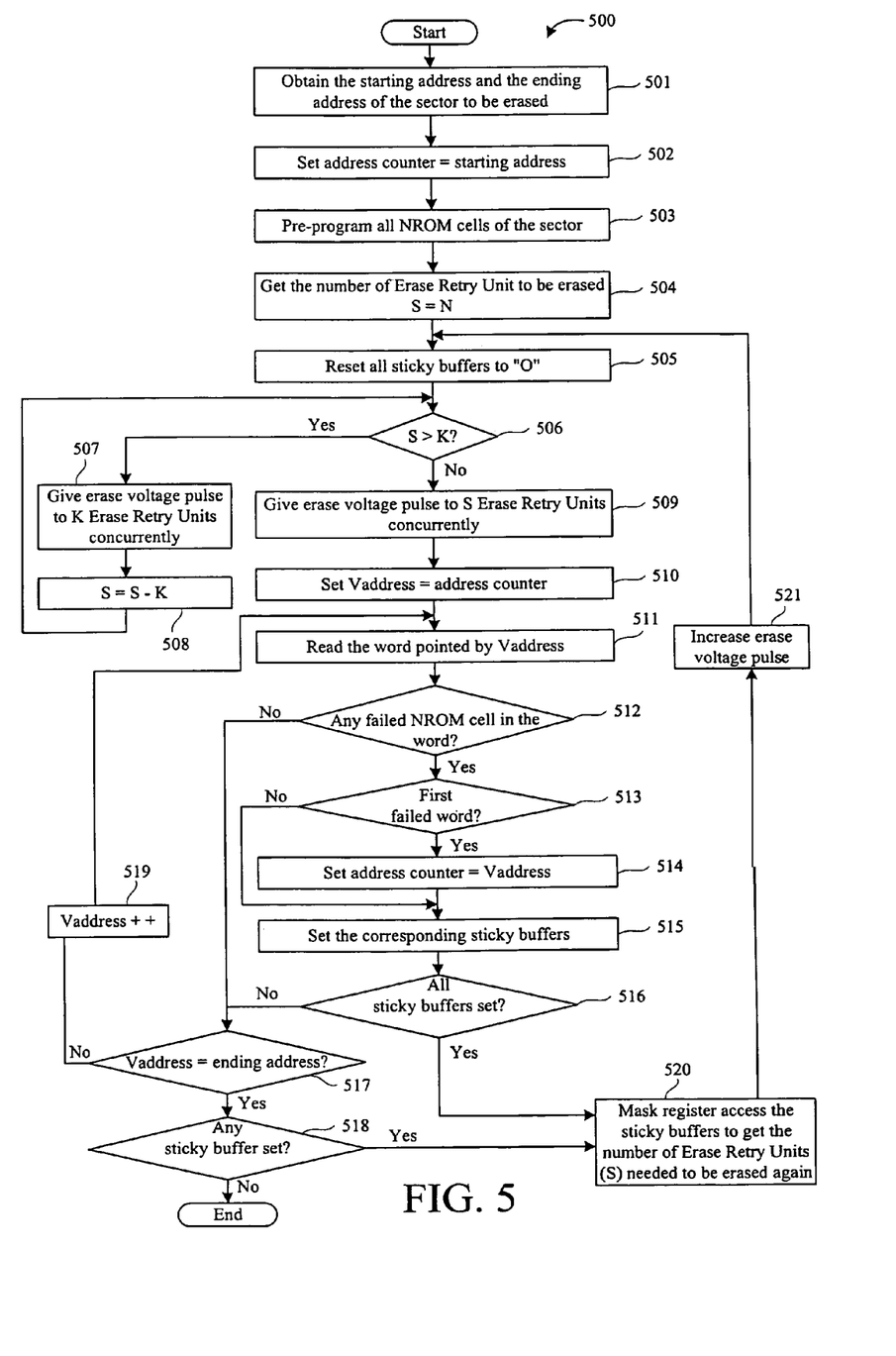
FIG. 5 is a flow chart outlining steps for a NROM erase method in accordance with one embodiment of the present invention.

Referring now to FIG. 5, a flow chart 500 is shown outlining steps of a NROM erase method in accordance with one embodiment of the present invention. The entry condition for the flow chart 500 is that a sector to be erased has been chosen. The sector to be erased is segmented into N erase retry units based on the number of sense amplifiers. N sticky buffers are provided to have each erase retry unit corresponding with one sense amplifier and one sticky buffer. A pre-determined K value, which is the maximum number of erase retry units that can be given an erase voltage pulse at the same time, is obtained.

The step 501 to step 504 are preparation steps for an erase operation that includes at least one erase process and at least one verification process. In step 501, the starting and ending addresses of the sector to be erased are obtained. In step 502, an address counter is given the starting address of the sector to be erased. In step 503, all the NROM cells belonging to the sector to be erased are pre-programmed to "0". In step 504, the number of the erase retry units needed to be erased during an erase process of the erase operation is set to be the total number of the erase retry units of the sector (N).

An erase process starts from step 505 to step 509. In step 505, all sticky buffers are reset to "0" at the beginning of the erase process of the erase operation. In step 506, the number of the erase retry units that need to be erased (S) is compared with the pre-determined K value. If S is more than K, only K erase retry units will be given an erase voltage pulse (step 507), preferably starting from the left to the right to the sector. In step 508, the remaining number of the erase retry units that need to be erased is calculated by minus K from S. The remaining number of erase retry units will be compared with the pre-determined K value again in step 506. If the remaining number of the erase retry units is still more than K, step 507, step 508, and step 506 will be repeated until the remaining number of the erase retry units is less or equal to K. If the number of the erase retry units to be erased is not more than K, an erase voltage pulse is applied to those erase retry units in step 509. Thus, all the erase retry units that need to be erased are given to an erase voltage pulse once.

A verification process is followed starting from step 510 to step 519 after an erase process is performed. The verification process will read the entire sector word by word with one bit per erase retry unit per I/O. If some bits (NROM cells) of the word read are not erased after the erase process, the sense amplifiers, corresponding to the erase retry units at where those un-erased NROM cells locate, will pass the verification results to the corresponding sticky buffers which will be set to "1" accordingly.

In step 510, a verification address (Vaddress) is obtained from the address counter. This Vaddress is the starting address at where the verification process begins. In step 511, the verification process read the word pointed by the Vaddress. The word read will be checked in step 512 to determine whether all the bits (NROM cells) of the word read are erased. When the word read is a failed word (at least one bit of the word is not erased), this failed word is checked to see whether it is the first failed word after the verification process began in step 513. If it is the first failed word, the address of this first failed word will be stored in the address counter in step 514 and the verification process will continue to step 515. If the failed word is not the first failed word, the verification process will skip the step 514 and proceed to step 515. In step 515, the sticky buffers, corresponding to the un-erased erase retry units to where those un-erased NROM cells (bits) belong, will be set. In step 516, the N sticky buffers will be checked to see whether all of the sticky buffers are set to "1". If all the sticky buffers are set to "1", the verification process will be stopped no matter whether the verification process is finished or not.

When all the bits of the word read are erased (step 512), or when the N sticky buffers are not all set (step 516), the Vaddress pointed to the word read will be checked to determine whether this Vaddress is the ending address of the sector in step 517. If the Vaddress is the not ending address of the sector, the Vaddress is increase by one in step 519 and the verification process will continue from step 511 until the entire sector is read or until all the sticky buffers are set, whichever happens first. If the Vaddress is the ending address of the sector, all of the N sticky buffers will be checked in step 518 to find out whether any of the sticky buffers is set. If any of the sticky buffers is set, a mask register obtains the number of the erase retry units that need to be erased again (S) by checking the sticky buffers (step 520). The erase voltage pulse will be increased slightly in step 521 and another erase process will begin starting from the step 505. If no sticky buffers are set in step 518, the erase operation is ended, i.e., the entire sector is successfully erased.

Overall, the described NROM erase system 200 segments a sector of the NROM cell array 210 into erase retry units based on the number of sense amplifiers in the sense amplifier system 240. The sticky buffer system 310 uses sticky buffers to indicate whether their corresponding erase retry units are erased after an erase process. If any NROM cell belonging to an erase retry unit is not erased, the erase retry unit is considered un-erased and the sticky buffer corresponding to this un-erased erase retry unit will be set. A subsequent erase process will begin if any erase retry unit of the sector is not erased.

For a subsequent erase process, the subsequent erase voltage could be slightly higher than the erase voltage pulse used in the previous erase process. If some erase retry units are erased in the previous erase process, the increase for the subsequent erase voltage can be low. For example, the increase of an erase voltage can be as low as 200 mV. As a result, the erase voltage is optimized. Furthermore, because the subsequent erase voltage is only applied the erase retry units that are not erased in the previous erase process, the NROM cells of the erase retry units that are erased will not be affected in the subsequent erase process. Hence, the NROM erase system 200 reduces the over erase probability. Moreover, since the address counter 260 will store the address of the first failed word during a verification process, less time is needed for a subsequent verification process. In addition, the pre-determined K value decides the maximum number of erase retry units that can be erased concurrently, therefore, the K value also limits the band-to-band tunneling current during an erase operation.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A system for reducing over-erased memory cells, comprising:
   N sense amplifiers, N being an integer;
   at least one memory sector segmented by the N sense amplifiers into N erase retry units with one erase retry unit of the memory sector corresponding with one sense amplifier, the memory sector having a starting address and an ending address; and
   a data input buffer system, including,
   (a) at least N sticky buffers for showing whether any of the N erase retry units of the memory sector are erased after the erase process of the erase operation, the N sticky buffers corresponding with the N erase retry units and the N sense amplifiers with at least one sticky buffer corresponding with one erase retry unit of the memory sector and one sense amplifier, the erase process of the erase operation being followed by a verification process of the erase operation, the erase operation including at least one erase process and at least one verification process; and (b) a mask register for accessing the N sticky buffers to identify which erase retry units fail to be erased after the erase process of the erase operation.

2. The system for reducing over-erased memory cells as recited in claim 1, wherein the N sense amplifiers pass verification results of the N erase retry units to the N sticky buffers during the verification process of the erase operation.

3. The system for reducing over-erased memory cells as recited in claim 1, wherein the N sticky buffers will be set accordingly if any of the N erase retry units is not erased during the verification process of the erase operation, one of the N sticky buffers is set when at least one memory cell belonging to its corresponding erase retry unit is un-erased after the erase process of the erase operation, one of the N sticky buffers is not set when all memory cells belonging to its corresponding erase retry unit are erased after the erase process of the erase operation.

4. The system for reducing over-erased memory cells as recited in claim 3, wherein a subsequent erase process of the erase operation is performed if at least one of the N sticky buffers is set, a subsequent verification process of the erase operation will follow the subsequent erase process of the erase operation, the erase operation will continue until all of the N erase retry units of the memory sector are erased.

5. The system for reducing over-erased memory cells as recited in claim 4, wherein a subsequent erase voltage pulse is used for the subsequent erase process, the subsequent erase voltage pulse could be slightly higher than an erase voltage pulse used in the erase process, the subsequent erase voltage pulse is only applied to the erase retry units which are not erased by the erase process of the erase operation.

6. The system for reducing over-erased memory cells as recited in claim 1, further comprising:
a state machine for controlling internal embedded control algorithms during the erase operation.

* * * * *